US009184224B2

(12) United States Patent
Lee (10) Patent No.: US 9,184,224 B2
(45) Date of Patent: Nov. 10, 2015

(54) ORGANIC LIGHT-EMITTING DIODE DISPLAY AND MANUFACTURING METHOD THEREOF

(71) Applicant: Samsung Display Co., Ltd., Yongin, Gyeonggi-Do (KR)

(72) Inventor: Dae-Won Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/203,355

(22) Filed: Mar. 10, 2014

(65) Prior Publication Data

US 2015/0108433 A1    Apr. 23, 2015

(30) Foreign Application Priority Data

Oct. 22, 2013   (KR) .................. 10-2013-0126113

(51) Int. Cl.
| H01L 35/24 | (2006.01) |
| H01L 51/00 | (2006.01) |
| H01L 21/00 | (2006.01) |
| H01L 27/32 | (2006.01) |

(52) U.S. Cl.
CPC .................. *H01L 27/3276* (2013.01)

(58) Field of Classification Search
CPC .................................... H01L 27/3276
USPC ............................... 257/40; 438/26
See application file for complete search history.

(56) References Cited

U.S. PATENT DOCUMENTS

| 8,067,883 | B2 | 11/2011 | Wang |
| 8,564,198 | B2 | 10/2013 | Kim et al. |
| 2001/0045712 | A1 | 11/2001 | Mathew et al. |
| 2002/0131141 | A1 | 9/2002 | Saitoh |
| 2006/0221291 | A1 | 10/2006 | Hong et al. |
| 2008/0150422 | A1* | 6/2008 | Ohara .......................... 313/504 |
| 2011/0127548 | A1 | 6/2011 | Lee |
| 2012/0026074 | A1* | 2/2012 | Lee et al. ...................... 345/76 |
| 2013/0026505 | A1 | 1/2013 | Lee et al. |
| 2015/0115256 | A1 | 4/2015 | You |

FOREIGN PATENT DOCUMENTS

| JP | 2003-248214 A | 9/2003 |
| KR | 1999-0054225 A | 7/1999 |
| KR | 10-2000-0035044 A | 6/2000 |
| KR | 10-2006-0104093 A | 10/2006 |
| KR | 10-0688791 B1 | 2/2007 |
| KR | 10-2009-0029441 A | 3/2009 |
| KR | 10-2009-0041613 A | 4/2009 |
| KR | 10-2011-0041321 A | 4/2011 |
| KR | 10-2011-0059964 A | 6/2011 |
| KR | 10-2012-0139075 A | 12/2012 |
| KR | 10-2013-0014367 A | 2/2013 |

* cited by examiner

*Primary Examiner* — David S Blum
(74) *Attorney, Agent, or Firm* — Knobbe Martens Olson & Bear LLP (57) ABSTRACT

An organic light-emitting diode (OLED) display and a manufacturing method thereof are disclosed. One inventive aspect includes a first substrate, a second substrate, and a first insulation layer, a metal layer and a second insulation layer formed on the first insulation layer. The metal layer is formed on the first insulating layer and has a first through hole. The second insulation layer is formed on the metal layer and has a second through hole. The inventive aspect further includes a sealing member formed by filling the first and second through hole so as to seal the first substrate to the second substrate.

20 Claims, 7 Drawing Sheets

ORGANIC LIGHT-EMITTING DIODE DISPLAY AND MANUFACTURING METHOD THEREOF

CROSS-REFERENCE TO RELATED APPLICATIONS

This application claims the benefit of Korean Patent Application No. 10-2013-0126113, filed on Oct. 22, 2013, in the Korean Intellectual Property Office, the disclosure of which is incorporated herein in its entirety by reference.

BACKGROUND

1. Field

Various aspects of the disclosed technology relate to an organic light-emitting diode (OLED) display and a manufacturing method thereof with reduced dead space and improved substrates sealing.

2. Description of the Related Technology

Displays are the apparatuses for providing visual information such as images or pictures to a user. Particularly, organic light-emitting diode (OLED) displays, which are self-emitting displays that electrically excite an organic compound to emit light, have attracted much attention as next-generation display. This is because OLED displays can be driven at a low voltage. In addition, OLED displays can be made with a thin profile and have advantages such as wide viewing angles, fast response speeds, etc. This features overcome the limitations of traditional liquid crystal displays.

In the OLED display, a sealing member can be used to bond a lower substrate and an upper substrate. However, the area in which the sealing member is formed can be a dead space on which images or pictures cannot be displayed. Thus, methods for reducing the dead space and improving bonding force are widely desired.

SUMMARY OF CERTAIN INVENTIVE ASPECTS

One or more embodiments of the disclosed technology include an organic light-emitting diode (OLED) display that is capable of improved bonding and a method of manufacturing the same.

One or more embodiments of the disclosed technology include an OLED display that is capable of reducing a dead space and a method of manufacturing the same.

Additional aspects will be set forth in part in the description which follows and, in part, will be apparent from the description, or can be learned by practice of the presented embodiments.

According to one aspect of the disclosed technology, an OLED display includes: a first substrate including a display area and a peripheral area, a second substrate facing the first substrate, and a sealing member enabling the first substrate to adhere to the second substrate, wherein a first insulation layer, a metal layer formed on the first insulation layer and having at least one through hole in the peripheral area, and a second insulation layer formed on the metal layer and having a second through hole that overlaps the first through hole and has a size less than that of the first through hole are formed on the first substrate, and the sealing member fills the inside of each of the first and second through holes.

The metal layer can contact the sealing member.

A third through hole overlapping the first through hole and having a size less than that of the first through hole can be defined in the first insulation layer.

The second and third through holes can have the same size.

A buffer layer, a gate insulation layer, and an interlayer dielectric can be formed on the display area, the first insulation layer can be formed of the same material as at least one of the buffer layer and the gate insulation layer, and the second insulation layer can be formed of the same material as the interlayer dielectric.

A transistor including a gate electrode can be formed on the display area, and the metal layer can be formed of the same material as the gate electrode.

The metal layer and the gate electrode can be formed on the same layer.

The sealing member can have a maximum width of about 750 μm or less.

The first through hole can have a radius greater by about 3 μm or more than that of the second through hole.

The OLED display can further include a gold (Au) layer contacting a side surface of the sealing member.

The Au layer can include at least one of a first Au layer contacting the inside of the sealing member and a second Au layer contacting the outside of the sealing member.

The sealing member can further include a plurality of sealing branches surrounding the display area, wherein each of the sealing branches can have one end contacting the sealing member and the other end that does not contact the sealing member to enable the first substrate to adhere to the second substrate.

The other end can be exposed to the outside.

The sealing branches can be spaced apart from each other.

A reinforcing material for supplementing the adhesion between the first and second substrates can be filled between the two sealing branches adjacent to each other of the sealing branches.

The reinforcing material can include a polymer resin.

At least one of the sealing branches can perpendicularly contact the sealing member.

According to another aspect of the disclosed technology, a method of manufacturing an OLED display includes: preparing a first substrate having a display area and a peripheral area surrounding the display area, successively forming a first insulation layer, a metal layer, and a second insulation layer on the peripheral area, forming a first through hole in the first insulation layer, the metal layer, and the second insulation layer, forming a second through hole having a size greater than that of the first through hole in the metal layer, and enabling the first substrate to adhere to a second substrate corresponding to the first substrate by using a sealing member filled into the first and second through holes.

The first through hole can be formed through a dry etch process.

The second through hole can be formed through a wet etch process.

An etchant can include molybdenum (Mo).

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Hereinafter, exemplary embodiments of the disclosed technology will be described in detail with reference to the accompanying drawings. The disclosed technology can, however, be embodied in different forms and should not be construed as limited to the embodiments set forth herein. Rather, these embodiments are provided so that this disclosure will be thorough and complete, and will fully convey the scope of the disclosed technology to those skilled in the art. Sizes of elements in the drawings can be exaggerated for convenience of explanation. In other words, since sizes and thicknesses of components in the drawings are arbitrarily illustrated for convenience of explanation, the following embodiments are not limited thereto.

In the following exemplary implementations, the x-axis, the y-axis and the z-axis are not limited to three axes of the rectangular coordinate system, and can be interpreted in a broader sense. In one exemplary implementation, the x-axis, the y-axis, and the z-axis can are perpendicular to one another, or can represent different directions that are not perpendicular to one another.

It will be understood that although the terms of first and second are used herein to describe various elements, these elements should not be limited by these terms. Terms are only used to distinguish one component from other components.

In the following description, technical terms are used only to explain a specific exemplary embodiment while not limiting the disclosed technology. The terms of a singular form may include plural forms unless referred to the contrary. The terms "include," "comprise," "including," and "comprising," as used herein, specify a component, a process, an operation, and/or an element but do not exclude other components, processes, operations, and/or elements. It will be understood that although the terms "first" and "second" are used herein to describe various elements, these elements should not be limited by these terms. These terms are only used to distinguish one component from other components.

It will be understood that when a layer, region, or component is referred to as being "formed on," another layer, region, or component, it can be directly or indirectly formed on the other layer, region, or component. That is, for example, intervening layers, regions, or components may be present.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it is directly on the other element or intervening elements may also be present.

Throughout this specification and the claims that follow, when it is described that an element is "connected" to another element, the element is "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element is not only directly connected to the second element but may also be indirectly connected to the second element via a third element. Further, some of the elements that are not essential to the complete understanding of the disclosed technology are omitted for clarity. Also, like reference numerals refer to like elements throughout.

Figure 1:
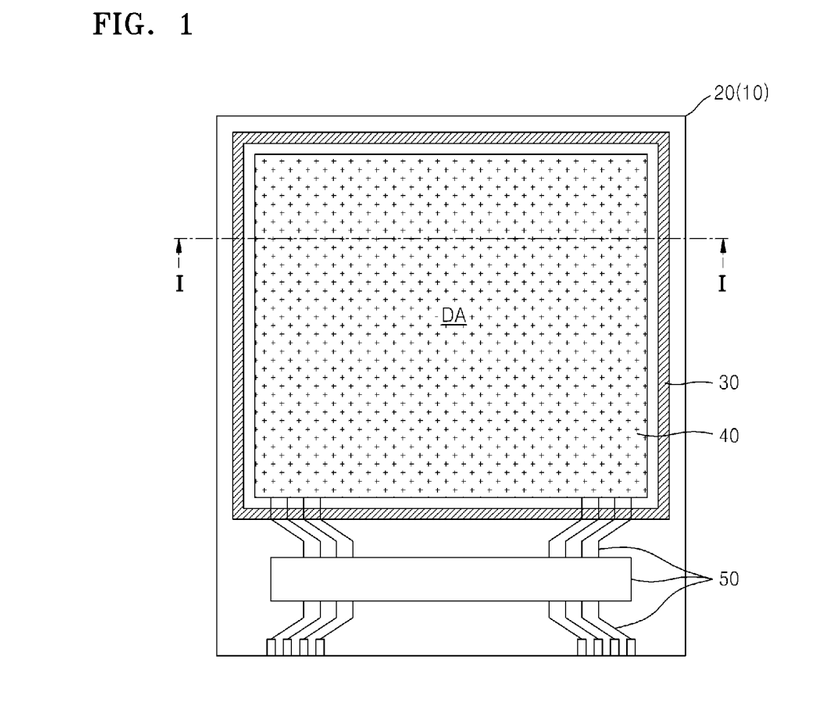
FIG. 1 is a plan view of an organic light-emitting diode (OLED) display according to an embodiment of the disclosed technology.
Figure 2:
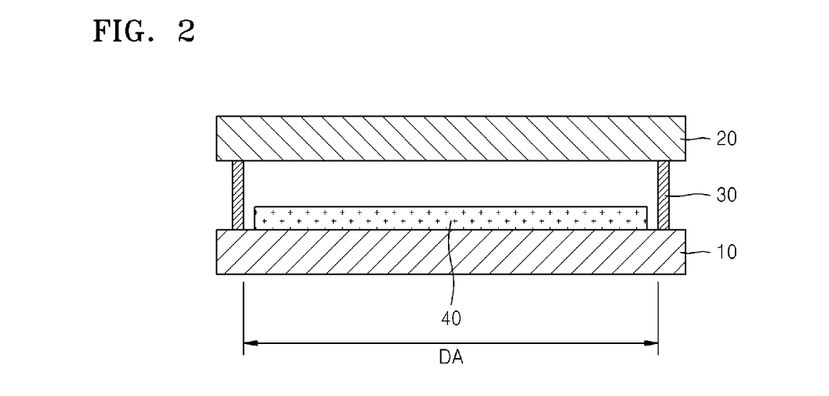
FIG. 2 is a cross-sectional view taken along line I-I of FIG. 1.

FIG. 1 is a plan view of an organic light-emitting diode (OLED) display according to an embodiment of the disclosed technology, and FIG. 2 is a cross-sectional view taken along line I-I of FIG. 1.

Referring to FIGS. 1 and 2, an OLED display includes a first substrate 10, a second substrate 20 facing the first substrate 10, and a sealing member 30. The first substrate 10 includes a display unit 40. The sealing member 30 surrounds the display unit 40 and bonds the first substrate 10 to the second substrate 20.

The first substrate 10 can be classified into a display area DA on which the display unit 40 is formed and a peripheral area PA surrounding the display area DA. The substrate 10 can be formed of a transparent glass material that contains SiO2 as a main component. However, the embodiment of the disclosed technology is not limited thereto. In one exemplary implementation, the substrate 10 is formed of a transparent plastic material. The substrate 10 can be a flexible substrate having flexibility. In another exemplary implementation, the flexible substrate is manufactured by using a polymer material such as a material that is lightweight due to low specific gravity, break-resistant, and bendable when compared to those of the glass substrate, such as, a flexible plastic film.

The display unit 40 of the first substrate 10 can include a transistor TR that is a thin film transistor for driving, a capacitor Cst, and an organic light-emitting diode (OLED) on the substrate 10. The display unit 40 will be described later in detail.

The second substrate 20 can correspond to the first substrate 10. The second substrate 20 can be formed of various materials such as glass materials, metal materials, or plastic materials. The first substrate 10 and the second substrate 20 are bonded to each other by using the sealing member 30. The sealing member 30 can include glass fit.

In detail, the sealing member 30 can surround the display unit 40 and be formed around the display unit 40. The sealing member 30 can seal the display unit 40 to protect the display unit 40 from the outside.

Figure 3:
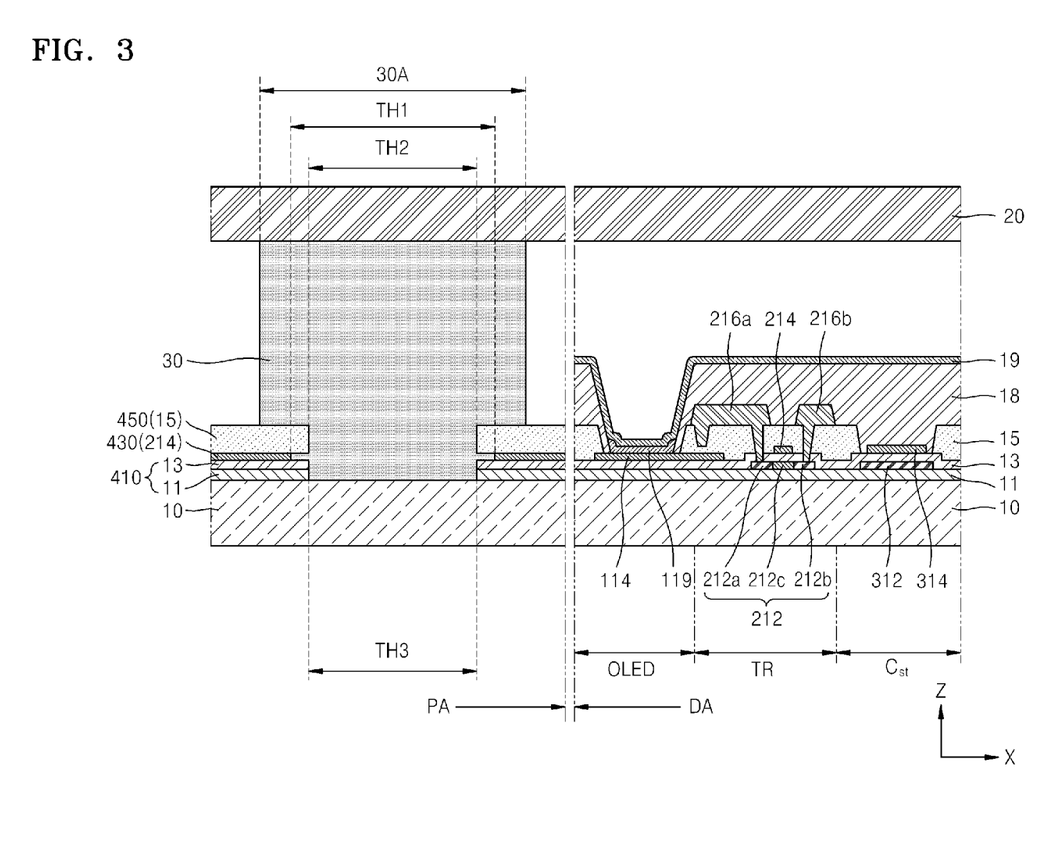
FIG. 3 is a detailed view of a display unit and a sealing member of FIG. 1.
Figure 4:
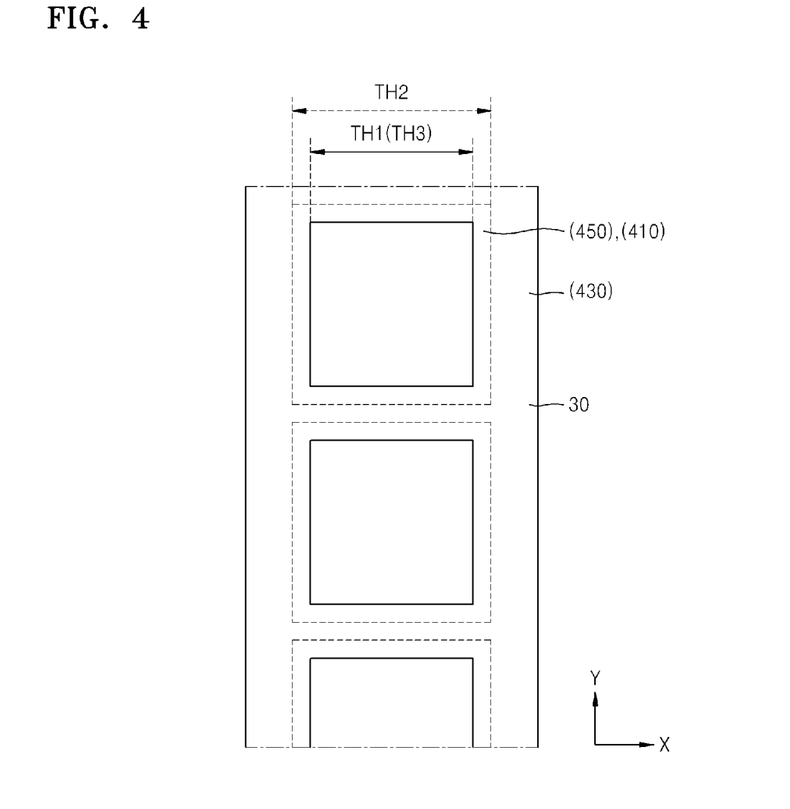
FIG. 4 is a schematic plan view of the sealing member of FIG. 3.

FIG. 3 is a detailed view of the display unit 40 and the sealing member 30 of FIG. 1, and FIG. 4 is a schematic plan view of the sealing member 30 of FIG. 3.

Referring to FIGS. 3 and 4, a buffer layer 11 canis further formed on the substrate 10. The buffer layer 11 can be formed of an inorganic material such as $SiO_x$, $SiN_x$, SiON, AlO, or AlON, or an organic material such as acrylic or polyimide. Alternatively, the inorganic material and the organic material can be alternately laminated on each other to form the buffer layer 11. The buffer layer 11 can block oxygen and moisture. Thus, the buffer layer 11 can prevent moisture or impurities generated from the substrate 10 from being diffused and adjust a thermal transfer rate when crystallized to facilitate crystallization of a semiconductor.

The display unit 40 of the first substrate 10 includes the transistor TR that is the thin film transistor for driving, the capacitor Cst, and the OLED on the substrate 10. In detail, the transistor TR is formed on the buffer layer 11. Although a bottom gate type thin film transistor is exemplified in the embodiment, a thin film transistor having a different structure such as a top gate type thin film transistor can be provided.

An active layer 212 is formed on the buffer layer 11. When the active layer 212 is formed of poly-silicon, amorphous silicon can be formed and then crystallized to change the amorphous silicon into the poly-silicon.

A method of crystallizing the amorphous silicon can include various methods such as a rapid thermal annealing (RTA) method, a solid phase crystallization (SPC) method, an eximer laser annealing (ELA) method, a metal induced crystallization (MIC) method, a metal induced lateral crystallization (MILC) method, a sequential lateral solidification (SLS) method, and the like. Here, a method in which a high-temperature heating process is not required can be used so as to be applied to the substrate according to the embodiment of the disclosed technology.

For example, when crystallized by using a low temperature poly-silicon (LTPS) process, laser may be irradiated onto the active layer 212 for a short time to activate the active layer 212. Here, the whole process may be performed below a temperature of about 300° C. to prevent the substrate 10 from being exposed at a high temperature of about 300° C. or more. Thus, the substrate formed of the polymer material may be applied to form the transistor TR.

N-type or P-type impurity ions can be doped into the active layer 212 to form a source region 212b and a drain region 212a. A channel region 212c in which impurities are not doped is formed between the source region 212b and the drain region 212a. A gate insulation layer 13 is formed on the active layer 212. The gate insulation layer 13 can have a single layer structure of $SiO_2$ or a double layer structure of $SiO_2$ and $SiN_x$.

A gate electrode 214 is formed on a predetermined area of the gate insulation layer 13. The gate electrode 214 is connected to a gate line (not shown) that applies a transistor on/off signal. The gate electrode 214 can be provided in a single or multiple conductive layer.

A drain electrode 216a and a source electrode 216b are formed on the gate electrode 214 with an interlayer dielectric 15 therebetween. The drain electrode 216a and source electrode 216b are respectively connected to the source region 212b and the drain region 212a of the active layer 212. The interlayer dielectric 15 can be formed of an insulating material such as $SiO_2$ or $SiN_x$. Alternatively, the interlayer dielectric 15 can be formed of an insulating organic material.

A pixel defining layer 18 is formed on the interlayer dielectric 15 to cover the drain electrode 216a and the source electrode 216b. Also, a pixel electrode 114 formed of the same transparent conductive material as the gate electrode 214 can be formed on the buffer layer 11 and the gate insulation layer 13. Each of the drain electrode 216a and the source electrode 216b can have resistance less than that of the gate electrode 214.

In the pixel electrode 114, at least one of metals having a low work function, i.e., Li, Ca, LiF/Ca, LiF/Al, Al, Mg, and compounds thereof can be deposited on an intermediate layer 119. Then, an auxiliary electrode formed of a material for forming a transparent electrode such as ITO, IZO, ZnO, or $In_2O_3$ can be formed on the intermediate layer 119 on which the metal is deposited. However, the pixel electrode 114 is not limited thereto. In one exemplary implementation, the pixel electrode 114 canis a reflective electrode.

A portion of the pixel defining layer 18 is etched to form the intermediate layer 119 on the pixel electrode 114. The intermediate layer 119 can include an organic emission layer to emit visible light.

An opposite electrode 19 as a common electrode is formed on the intermediate layer 119. Voltages having polarities different from each other can be applied to the intermediate layer 119 to emit light.

The organic emission layer of the intermediate layer 119 can be formed of a low-molecular organic material or a high-molecular organic material.

When the organic emission layer of the intermediate layer 119 is formed of the low-molecular organic material, the intermediate layer 119 can have a single layer or multilayer structure of at least one of a hole injection layer (HIL), a hole transport layer (HTL), an electron transport layer (ETL), and an electron injection layer (EIL).

Also, the organic material that is capable of being used for the intermediate layer 119 can include copper phthalocyanine (CuPc), N,N'-Di(naphthalene-1-yl)-N, N'-diphenyl-benzidine (NPB), tris-8-hydroxyquinoline aluminum (Alq3), or the like. The low-molecular organic material can be formed through a vacuum deposition method using masks.

When the organic emission layer of the intermediate layer 119 is formed of the high-molecular organic material, the intermediate layer 119 can have a structure including the HTL and the EML. Here, the HTL can be formed of PEDOT. The light emission layer can be formed of a poly-phenylenevinylene (PPV)-based or polyfluorene-based high-molecular organic material. The high-molecular organic material can be formed through a screen printing method or inkjet printing method. However, the intermediate layer 119 is not limited thereto, and thus various embodiments can be applied to the intermediate layer 119.

The opposite electrode 19 can be provided as a transparent electrode or reflective electrode, like the pixel electrode 114. When the opposite electrode 19 is used as the transparent electrode, in the opposite electrode 19, at least one of metals having a low work function, i.e., Li, Ca, LiF/Ca, LiF/Al, Al, Mg, and compounds thereof can be deposited on an intermediate layer 119. Then, an auxiliary electrode formed of a material for forming a transparent electrode such as ITO, IZO, ZnO, or $In_2O_3$ can be formed on the intermediate layer 119 on which the metal is deposited.

When the opposite electrode 19 is used as the reflective electrode, the opposite electrode 19 can be formed by entirely depositing at least one of Li, Ca, LiF/Ca, LiF/Al, Al, Mg, and compounds thereof.

When the pixel electrode 114 is provided as the transparent electrode or reflective electrode, the pixel electrode 114 can have a shape corresponding to an opened shape of each of pixels. The opposite electrode 19 can be formed by entirely depositing the transparent electrode or reflective electrode on an entire display area. It is not necessary to entirely deposit the transparent electrode or reflective electrode on the opposite electrode 19. In some exemplary implementations, the transparent electrode or reflective electrode canis deposited on the opposite electrode 19 in various patterns. Here, the pixel electrode 114 and the opposite electrode 19 can be laminated on positions opposite to each other.

In the OLED display according to a current embodiment, the pixel electrode 114 canis used as an anode. The opposite electrode 19 canis used as cathode. Here, the polarities of the pixel electrode 114 and the opposite electrode 19 can are applied in reverse.

In the peripheral area of the first substrate 10, a first insulation layer 410, a metal layer 430 formed on the first insulation layer 410 and having at least one through hole TH1 in the peripheral area, and a second insulation layer 450 formed on the metal layer 430 and having a second through hole TH2 having a radius less than that of the first through hole TH1. The sealing member 30 can be filled into the first and second through holes TH1 and TH2 to bond the first substrate 10 to the second substrate 20. Here, the first insulation layer 410 can be formed of the same material as at least one of the buffer layer 11 and the gate insulation layer 13. The second insulation layer 450 can be formed of the same as the interlayer dielectric 15. Although the buffer layer 11 and the gate insulation layer 13 are provided as the first insulation layer 410 in FIG. 3, the embodiment of the disclosed technology is not limited thereto. In some exemplary implementations, only the gate insulation layer 13 canis provided as the first insulation layer 410.

Also, the first insulation layer 410 can overlap the first through hole TH1 to form a third through hole TH3 having a radius less than that of the first through hole TH1. Although the second and third through holes TH2 and TH3 have the same radius as each other in FIG. 3, the embodiment of the disclosed technology is not limited thereto. The third through hole TH3 can have a radius greater or less than that of the second through hole TH2. However, since the second and third through holes TH2 and TH3 overlap the first through hole TH1, each of the second and third through holes TH2 and TH3 can have a radius less than that of the first through hole TH1.

The metal layer 430 formed between the first insulation layer 410 and the second insulation layer 450 can be formed of the same material as the gate electrode 214 of the above-described thin film transistor TFT. In detail, the metal layer 430 can be formed on the same layer as the gate electrode 214. In one exemplary implementation, the metal layer 430 can extends from the gate electrode 214.

In FIG. 3, the metal layer 430 is formed on the gate insulation layer 13, like the gate electrode 214. In some implementations, the metal layer 430 canis formed of the same material as the drain or source electrode 216a or 216b of the thin film transistor TFT and can be formed on the same layer as the drain or source electrode 216a or 216b. For convenience of description, the implementation in which the metal layer 430 is formed of the same material as the gate electrode 214 and formed on the same layer as the gate electrode 214 will be described below.

When the first and second substrates 10 and 20 are bonded to each other by using the sealing member 30, ultraviolet (UV) light or laser beams can be irradiated to cure the sealing member 30. In detail, the UV light or laser beams can pass through the second substrate 20. Then, the UV light or laser beams can be irradiated onto the sealing member 30. Thus, the metal layer 430 is formed under the sealing member 30, the UV light or laser beams passing through the sealing member 30 can be reflected from the metal layer 430 and thus emitted again toward the sealing member 30 to improve irradiation efficiency of the UV light or laser beams. However, the bonded sealing member 30 can be limited in width due to a limitation in irradiation width of the UV light or laser beams. Generally, the sealing member 30 can have a width of about 750 μm or less.

An area of the sealing member 30 contacting the second substrate 20 can be easily observed through the second substrate 20 formed of a transparent material. On the other hand, an area of the sealing member 30 contacting the first substrate 30 can not be observed by the metal layer 430 formed of an opaque material. Thus, since the meal layer 430 has the at least one first through hole TH1, the contact area between the sealing member 30 and the first substrate 10 can be observed.

In addition, since the first through hole TH1 of the metal layer 430 has a radius greater than that of each of the second and third through holes TH2 and TH3 adjacent to the metal layer 430, the first and second insulation layers 410 and 450 can hold the sealing member 30 filled into the first through hole TH1. The first through hole TH1 can have a radius greater by about 3 μm or more than that of each of the second and third through holes TH2 and TH3. Thus, the bonding areas of the first and second insulation layers 410 and 450 and the metal layer 430 with respect to the sealing member 30 can increase, and also, delamination of the sealing member 30 from the first insulation layer 410, the second insulation layer 450, or the metal layer 430 can be prevented.

In FIGS. 3 and 4, one first through hole TH1, one second through hole TH2, and one third through hole TH3 can are defined in a width direction of the sealing member 30. However, the embodiment of the disclosed technology is not limited thereto. In some exemplary implementations, a plurality of first through holes TH1, a plurality of second through holes TH2, and a plurality of third through holes TH3 can are defined in the width direction of the sealing member 30.

Figure 5:
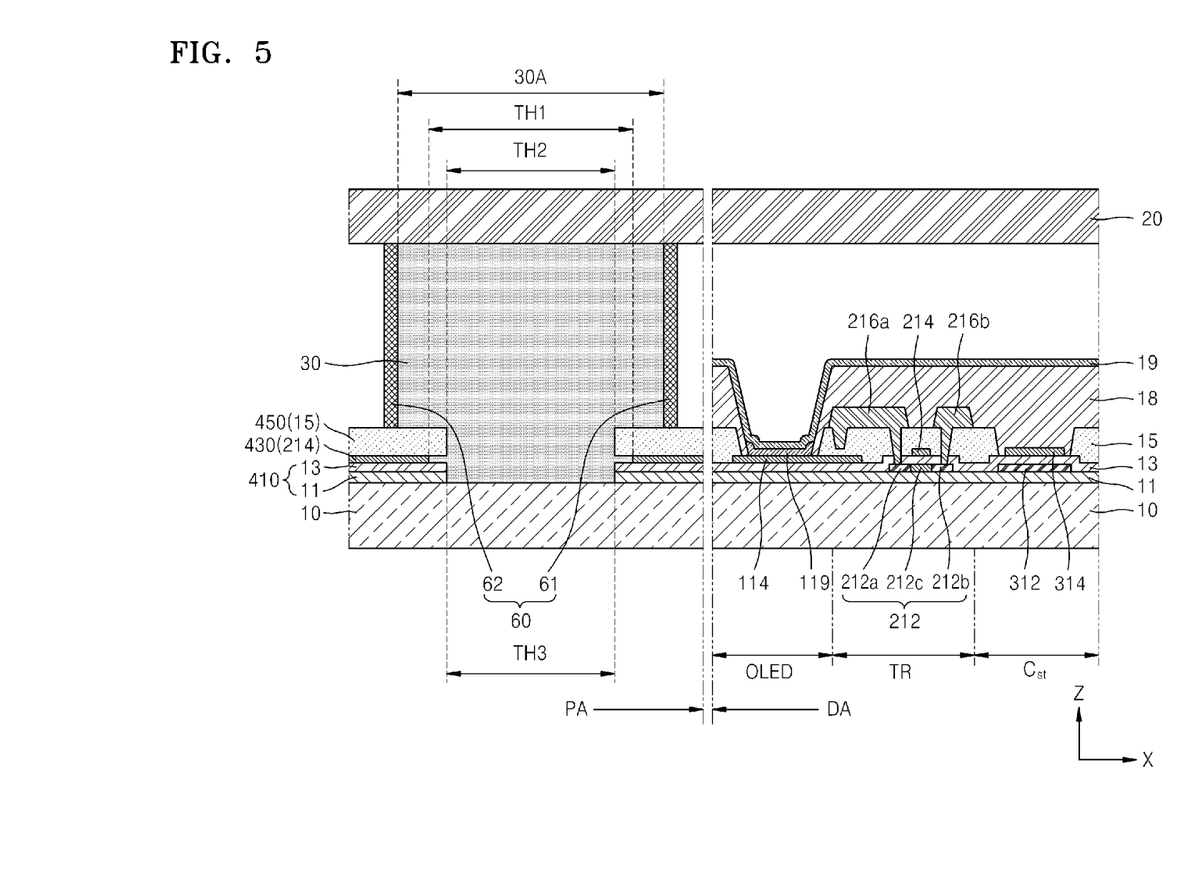
FIG. 5 is a schematic cross-sectional view illustrating a portion of an OLED display according to another embodiment of the disclosed technology.

FIG. 5 is a schematic cross-sectional view illustrating a portion of an OLED display according to another embodiment of the disclosed technology. Unlike the OLED display of FIG. 3, the OLED display of FIG. 5 can further includes a gold (Au) layer 60 contacting a sealing member 30 to reduce a dead space. When a display area DA is defined as the inside of the sealing member 30, and a peripheral area PA is defined as the outside of the sealing member 30 with respect to the sealing member 30, the Au layer 60 can include a first Au layer 61 contacting the inside of the sealing member 30 and a second Au layer 62 contacting the outside of the sealing member 30.

Although the first and second Au layers 61 and 62 are illustrated in FIG. 5, the embodiment of the disclosed technology is not limited thereto. In some exemplary implementations, the Au layer 60 can includes only the first Au layer 61 or only the second Au layer 62. Also, the Au layer 60 can be formed on the same layer as a portion of the sealing member 30 on a first substrate 10. In one exemplary implementation, an edge area of the sealing member 30 canis formed on a second insulation layer 450, and the Au layer 60 can also be formed to contact the sealing member on the second insulation layer 450.

Since the Au layer 60 has flexibility, the Au layer 60 can have superior adhesion with respect to the sealing member 30 formed of glass frit. In detail, when laser processing is performed, the Au layer 60 can increase in volume to adhere to the sealing member 30 while filling a space between the Au layer 60 and the sealing member 30. Also, since gold (Au) is not naturally oxidized, the Au layer 60 can prevent the sealing member 30 from contacting external air to prevent the sealing member 30 from being oxidized or volatilized. Thus, the Au layer 60 can realize the sealing member 30 to have a small area and therefore, reduce the dead space. In one exemplary implementation, the sealing member 30 canis manufactured with a width of about 680 µm or less.

Figure 6:
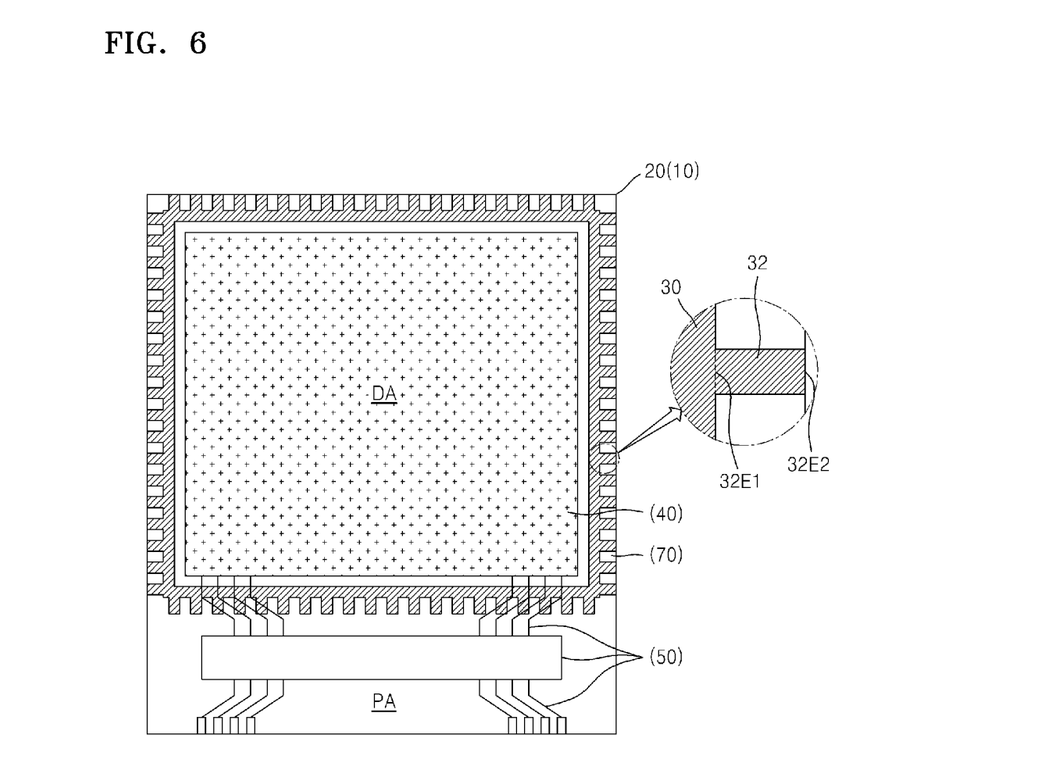
FIG. 6 is a schematic view illustrating a portion of an OLED display according to further another embodiment of the disclosed technology.

FIG. 6 is a schematic view illustrating a portion of an OLED display according to further another embodiment of the disclosed technology. When compared to FIG. 3, an OLED display of FIG. 6 can includes a plurality of sealing branches 32. Each of the sealing branches 32 can has one end contacting the sealing member 30 and the other end that does not contact the sealing member 30. A first substrate 10 can adheres to a second substrate 20 by the sealing branches 32. The sealing branch 32 can be formed of the same material as the sealing member 30. In some exemplary implementations, each of the sealing member 30 and the sealing branch 32 can include glass frit.

Particularly, the sealing member 30 can seal a display unit 40 to protect the display unit from the outside. Also, the sealing branch 32 can formed outside the sealing member 30. Here, the sealing branch 32 can have one end 32E1 contacting the sealing member 30 and the other end 32E2 exposed to the outside.

Since the sealing branch 32 is provided in addition to the sealing member 30, a contact area between the sealing material and the first and second substrates 10 and 20 can increase. Also, since the contact area increases, adhesion force between the first and second substrates 10 and 20 can increase. Although the contact area increases when the sealing member 30 is formed on an entire peripheral area except for a pad unit 50, cracks can occur. Thus, the OLED display according to an embodiment can include the sealing branches 32 so that the contact area increases, and also, the occurrence of the cracks is prevented.

Also, the sealing branches 32 can be spaced apart from each other. At least one of the sealing branches 32 can vertically contact the sealing member 30. In one exemplary implementation, at least one of the sealing branches 32 can has a longitudinal direction perpendicular to a normal line of the sealing member 30. Although the sealing branches 32 vertically contact the sealing member 30 in FIG. 6, the embodiment of the disclosed technology is not limited thereto. In another exemplary implementation, a portion of the sealing branches 32 canis perpendicularly formed with respect to the sealing member 30. The other portion of the sealing branches 32 canis inclinedly formed with respect to the sealing member 30. Since the sealing branch 32 is inclinedly formed with respect to the sealing member 30, the contact area between the sealing member 30 and the first and second substrates 10 and 20 can further increase.

A reinforcing material 70 for supplementing the adhesion of the sealing branches 32 can be formed between the two adjacent sealing branches 32. The reinforcing material 70 can be formed of a resin, such as, a polymer resin. The reinforcing material 70 can supplement mechanical strength that is weakened by thermal shock and stress which can occur due to thermal mismatch between the glass frit of the sealing member 30 and the glass of each of the first and second substrates 10 and 20.

Although the OLED display is described so far, the embodiments of the disclosed technology are not limited thereto. In one exemplary implementation, a method of manufacturing the OLED display can also belongs to the scope of the prevent invention.

FIGS. 7A to 7D are views of a process for manufacturing an OLED display according to an embodiment of the disclosed technology.

Figure 7A:
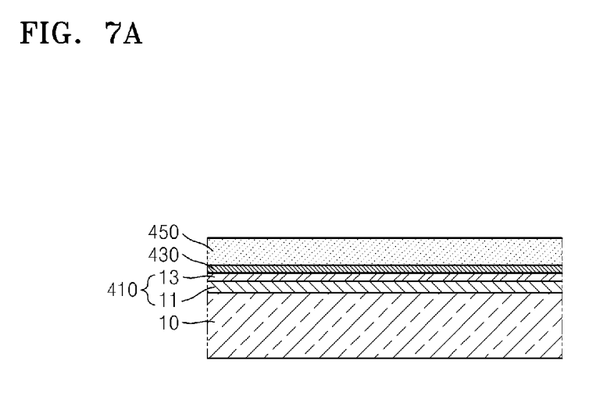
FIGS. 7A to 7D are views of a process for manufacturing an OLED display according to an embodiment of the disclosed technology.

To manufacture an OLED display, a first substrate 10 having a display area DA and a peripheral area PA surrounding the display area DA is prepared. Then, a display unit and a pad unit are formed on the first substrate 10. In one exemplary implementation, a buffer layer 11, a gate insulation layer 13, a metal layer 430, and an interlayer dielectric 15 can are formed over the display area DA and the peripheral area PA of the first substrate 10. Then, an organic light-emitting diode (OLED), a transistor TR, and a capacitor Cst can be formed on the display area DA. Particularly, as shown in FIG. 7A, a first insulation layer 410, a metal layer 430, and a second insulation layer 450 can are successively formed on the first substrate 10 on the peripheral area PA. Here, the first insulation layer 410 canis formed of the same material as at least one of the buffer layer 11 and the gate insulation layer 13. The metal layer 430 canis formed of the same material as an electrode of the transistor TR. The second insulation layer 450 canis formed of the same material as the interlayer dielectric 15.

Figure 7B:
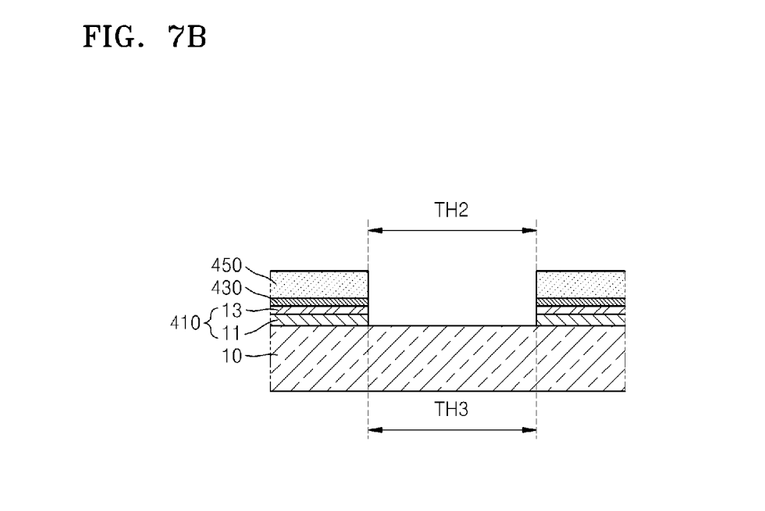

Also, as shown in FIG. 7B, second and third through holes TH2 and TH3 can be formed in the first insulation layer 410, the metal layer 430, and the second insulation layer 450 which are formed on the peripheral area PA of the first substrate 10. The second and third through holes TH2 and TH3 can be formed through a dry etch process. The second and third through holes TH2 and TH3 can have the same size. Also, a through hole can be formed in the meal layer 430.

Figure 7C:
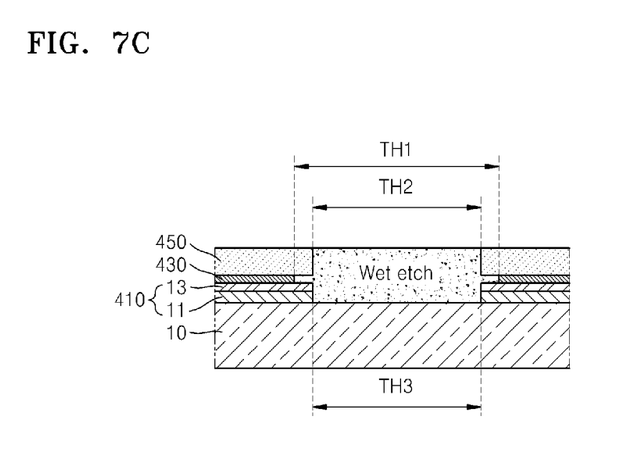

As shown in FIG. 7C, a first through hole TH1 canis formed in the metal layer 430. The first through hole TH1 can be formed through a wet etch process. A solution containing molybdenum (Mo) can be used as etchant. When a predetermined time elapses after the etchant is introduced into the second through hole TH2, a side surface of the metal layer 430 can be etched by the etchant to form the first through hole TH1 in the metal layer 430. The wet etch process can be performed so that the first through hole TH1 has a radius greater by about 3 µm or more than that of the second through hole TH2.

Figure 7D:
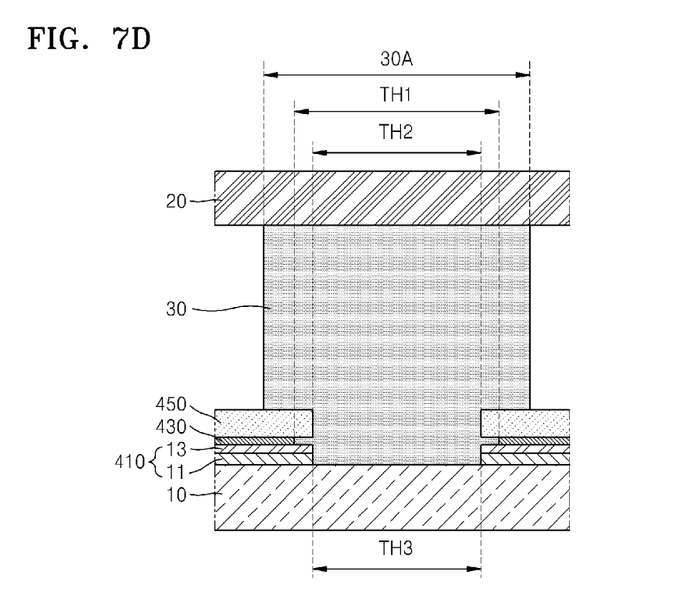

As shown in FIG. 7D, a material for forming the sealing member 30 canis filled into the first and second through holes TH1 and TH2. Then, the first substrate 10 and a second substrate 20 corresponding to the first substrate 10 can adhere to each other by using the sealing member 30. The first and second substrates 10 and 20 are aligned with each other. Then, when UV light or laser beams are irradiated onto an upper portion of the second substrate 20, the sealing member 30 between the first and second substrates 10 and 20 are cured. When the UV light or laser beams are irradiated onto the sealing member 30, the metal layer 430 overlapping the sealing member 30 on the first substrate 10 can reflect the UV light or laser beams. Thus, the sealing member 30 can be primarily cured by the UV light or laser beams that are irradiated from an upper side of the second substrate 20. Them, the sealing member 30 can be secondarily cured by the UV light or laser beams that are reflected by the metal layer 430. Therefore, the sealing member 30 can be firmly cured. In addition, since the first and second insulation layers 410 and 450 hold the sealing member 30 filled into the first through hole TH1, delamination of the sealing member 30 can be reduced.

As described above, according to the embodiments of the disclosed technology, the OLED display can be improved in adhesion force.

Also, the dead space of the OLED display can be reduced.

In addition, the oxidation and volatilization of the sealing member can be prevented.

For purposes of summarizing the disclosed technology, certain aspects, advantages and novel features of the disclosed technology have been described herein. It is to be understood that not necessarily all such advantages is achieved in accordance with any particular embodiment of the disclosed technology. Thus, the disclosed technology is embodied or carried out in a manner that achieves or optimizes one advantage or group of advantages as taught herein without necessarily achieving other advantages as is taught or suggested herein.

Various modifications of the above described embodiments will be readily apparent, and the generic principles defined herein is applied to other embodiments without departing from the spirit or scope of the disclosed technology. Thus, the disclosed technology is not intended to be limited to the embodiments shown herein but is to be accorded the widest scope consistent with the principles and novel features disclosed herein.

While one or more embodiments of the disclosed technology have been described with reference to the figures, it will be understood by those of ordinary skill in the art that various changes in form and details can be made therein without departing from the spirit and scope of the disclosed technology as defined by the following claims.

What is claimed is:

1. An organic light-emitting diode (OLED) display comprising:
    a first substrate including a display area and a peripheral area;
    a second substrate facing the first substrate;
    a sealing member configured to adhere the first substrate to the second substrate; and
    a first insulation layer, a metal layer and a second insulation layer formed on the first substrate,
    wherein the metal layer is formed on the first insulation layer and has at least a first through hole in the peripheral area,
    wherein the second insulation layer is formed on the metal layer and has at least one second through hole that is concentric with the first through hole,
    wherein the second through hole has a diameter less than that of the first through hole, and
    wherein the sealing member fills each of the first and second through holes.

2. The OLED display of claim 1, wherein the metal layer contacts the sealing member.

3. The OLED display of claim 1, wherein a third through hole is defined in the first insulation layer and overlaps the first through hole, and wherein the third through hole has a diameter less than that of the first through hole.

4. The OLED display of claim 3, wherein the second and third through holes have the same diameter.

5. The OLED display of claim 1 further comprising
    a buffer layer, a gate insulation layer and an interlayer dielectric are formed in the display area,
    wherein the first insulation layer is formed of the same material as at least one of the buffer layer and the gate insulation layer, and
    wherein the second insulation layer is formed of the same material as the interlayer dielectric.

6. The OLED display of claim 1, further comprising a transistor formed in the display area, wherein the transistor includes a gate electrode, and wherein the metal layer is formed of the same material as the gate electrode.

7. The OLED display of claim 6, wherein the metal layer and the gate electrode are formed on the same layer.

8. The OLED display of claim 1, wherein the sealing member has a maximum width of about 750 µm or less.

9. The OLED display of claim 1, wherein the first through hole has a radius greater by about 3 µm or more than that of the second through hole.

10. The OLED display of claim 1, further comprising a gold (Au) layer contacting a side surface of the sealing member.

11. The OLED display of claim 10, wherein the Au layer comprises at least one of a first Au layer contacting the inside of the sealing member and a second Au layer contacting the outside of the sealing member.

12. The OLED display of claim 1, wherein the sealing member further comprises a plurality of sealing branches surrounding the display area, wherein one end of each of the sealing branches adheres to the first substrate and the second substrate.

13. The OLED display of claim 12, wherein the other end is exposed to the environment.

14. The OLED display of claim 12, wherein the sealing branches are spaced apart from each other.

15. The OLED display of claim 12, further comprising a reinforcing material to reinforce the adhesion between the first and second substrates, wherein the reinforcing material fills the space between two adjacent sealing branches.

16. The OLED display of claim 15, wherein the reinforcing material is formed of a polymer resin.

17. The OLED display of claim 12, wherein at least one of the sealing branches perpendicularly contacts the sealing member.

18. A method of manufacturing an organic light-emitting diode (OLED) display, the method comprising:
    forming a first substrate having a display area and a peripheral area surrounding the display area;
    forming a first insulation layer on the peripheral area of the first substrate;
    forming a metal layer on the first insulation layer;
    forming a second insulation layer on the metal layer;
    forming a first through hole through the first insulation layer, the metal layer and the second insulation layer;
    forming a second through hole having a diameter less than that of the first through hole in the metal layer; and
    filling the first and second through holes with a sealing material so as to seal the first substrate to a second substrate.

19. The method of claim 18, wherein the first through hole is formed through a dry etch process.

20. The method of claim 18, wherein the second through hole is formed through a wet etch process.

* * * * *